(12) United States Patent
Chen et al.

(10) Patent No.: US 7,745,807 B2
(45) Date of Patent: Jun. 29, 2010

(54) CURRENT CONSTRICTING PHASE CHANGE MEMORY ELEMENT STRUCTURE

(75) Inventors: Chieh-Fang Chen, Banciao (TW); Shih Hung Chen, Jhudong Township (TW); Yi-Chou Chen, Hsinchu (TW); Thomas Happ, Tarrytown, NY (US); Chia Hua Ho, Kaohsiung (TW); Ming-Hsiang Hsueh, Hsinchu (TW); Chung Hon Lam, Peekskill, NY (US); Hsiang-Lan Lung, Hsinchu (TW); Jan Boris Philipp, Peekskill, NY (US); Simone Raoux, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 11/776,301

(22) Filed: Jul. 11, 2007

(65) Prior Publication Data
US 2009/0014704 A1 Jan. 15, 2009

(51) Int. Cl.
*H01L 29/02* (2006.01)
(52) U.S. Cl. .............. 257/2; 257/3; 257/4; 257/5; 257/E29.002; 438/102; 438/103; 365/163
(58) Field of Classification Search .......... 257/1–5, 257/E29.002; 438/102–103; 365/202, 163
See application file for complete search history.

(56) References Cited

U.S. PATENT DOCUMENTS

| 5,825,046 | A | 10/1998 | Czubatyj et al. |
| 2005/0014357 | A1* | 1/2005 | Bao et al. ............... 438/618 |
| 2006/0110878 | A1* | 5/2006 | Lung et al. ............. 438/253 |
| 2006/0291268 | A1* | 12/2006 | Happ et al. ............. 365/103 |

OTHER PUBLICATIONS

Yamashita, Ichiro, "Bio Nano Process: Fabrication of Nanoelectronic Devices Using Protein Supramolecules" IEEE International Electron Devices Meeting, 1-4244-0439-8/06, 2006.

* cited by examiner

*Primary Examiner*—Bradley K Smith
*Assistant Examiner*—Jami M Valentine
(74) *Attorney, Agent, or Firm*—Scully, Scott, Murphy & Presser, P.C.; Vazken Alexanian

(57) ABSTRACT

A layer of nanoparticles having a dimension on the order of 10 nm is employed to form a current constricting layer or as a hardmask for forming a current constricting layer from an underlying insulator layer. The nanoparticles are preferably self-aligning and/or self-planarizing on the underlying surface. The current constricting layer may be formed within a bottom conductive plate, within a phase change material layer, within a top conductive plate, or within a tapered liner between a tapered via sidewall and a via plug contains either a phase change material or a top conductive material. The current density of the local structure around the current constricting layer is higher than the surrounding area, thus allowing local temperature to rise higher than surrounding material. The total current required to program the phase change memory device, and consequently the size of a programming transistor, is reduced due to the current constricting layer.

20 Claims, 15 Drawing Sheets

CURRENT CONSTRICTING PHASE CHANGE MEMORY ELEMENT STRUCTURE

FIELD OF THE INVENTION

The present invention relates to semiconductor structures, and particularly to phase change memory element structures having a current constricting layer and methods of manufacturing the same.

BACKGROUND OF THE INVENTION

A phase change memory (PCM) device is a non-volatile memory device employing a change in resistivity of a phase change material. The PCM device is also called phase-change random access memory (PRAM). Typically, a chalcogenide material capable of switching between an amorphous state and a crystalline state is employed in PCM devices.

Depending on the cooling rate from a liquid state, the chalcogenide material may form an amorphous chalcogenide glass or a chalcogenide crystal. The difference between the two states is physically characterized by the presence or absence of a long range order. Further, the crystalline and amorphous states of chalcogenide material have drastically different resistivity values. By manipulating the phase of the chalcogenide material, a binary data bit may be written into a PCM device. By detecting the phase of the chalcogenide material, typically in the form of a resistivity measurement, the binary data bit stored in the PCM device may be read. Many types of PCM devices employing these methods are known in the art.

A typical chalcogenide material used in PCM devices is a germanium, antimony and tellurium compound commonly called GST ($Ge_2Se_2Te_5$). Along with oxygen, sulfur, selenium, and polonium, tellurium belongs to the chalcogen group, hence the name chalcogenide material. In a typical PCM device, a chalcogenide glass having a high resistivity value may be formed upon melting and rapid cooling of a chalcogenide material. Alternatively, a chalcogenide crystal having a low resistivity value may be formed by raising the temperature to a crystallization temperature, which is below the melting temperature, followed by a slow cooling of the chalcogenide material. The chalcogenide becomes liquid at a relatively high temperature, e.g., above 600° C.

Referring to FIG. 1, a prior art phase change memory (PCM) element structure comprises a stack of a bottom conductive plate 10, a phase change material layer 20, and a top conductive plate 30. By passing current through the PCM element structure, the phase change material in the phase change material layer 20 is heated to a temperature that can induce a phase change, i.e., either above the melting temperature or the crystallization temperature.

One of the challenges of present day PCM element structures is to generate sufficient heat to reach the melting temperature of the phase change material. While not every portion of the phase change material needs to melt to encode data in the PCM element, at least a portion of the phase change material capable of significantly affecting the overall resistance of the PCM element structure needs to reach the phase transition temperatures, i.e., the melting temperature and/or the crystallization temperature, in order for the phase change material to change its state between a crystalline structure and an amorphous structure. To induce such melting or recrystallization, a relatively large amount of current is typically required. However, application of such a large current requires a large transistor, and consequently a large semiconductor area, making it difficult to increase the density of PCM devices.

A method of reducing current demand on a PCM element structure by mixing a phase change material with an inactive dielectric material has been disclosed in the U.S. Pat. No. 5,825,046 to Czubatyj et al. FIG. 2 schematically represents the prior art structure by Czubatyj et al., in which a mixed phase change material layer 20' comprises a phase change material 21 intermixed with the inactive dielectric material 26. The mixing of the phase change material 21 with the inactive dielectric material 26 decreases the cross-sectional area for the electrical current path between the bottom conductive plate 10 and the top conductive plate 30, thus increasing the current density within the mixed phase change material layer 20'. For a given level of current between the bottom conductive plate 10 and the top conductive plate 30, the mixed phase change material layer 20' in FIG. 2 provides higher local temperature than the phase change material layer 20 in FIG. 1.

While Czubatyj et al. provides a structure that enhances the local temperature of a mixed phase change material layer, the mixing process is stochastic, i.e., statistical variations in the mixing process produces non-uniform mixing, resulting in significant variations in the resistance of the mixed phase change material layer.

Therefore, there exists a need for a phase change memory element structure capable of achieving phase transition temperatures in a phase change material layer consistently with less programming current and methods of manufacturing the same.

Further, there exists a need for a phase change memory element structure with a higher resistance in the phase change material layer, in which the resistance values have a tight distribution, and methods of manufacturing the same.

SUMMARY OF THE INVENTION

The present invention addresses the needs described above by providing phase change memory structures having a current path that is constricted by insulating nanoparticles between a bottom conductive plate and a top conductive structure.

Specifically, a layer of nanoparticles having a dimension on the order of about 10 nm is employed to form a current constricting layer or as a hardmask for forming a current constricting layer from an underlying insulator layer. The nanoparticles are preferably self-aligning and/or self-planarizing on the underlying surface. The current constricting layer may be formed within a bottom conductive plate, within a phase change material layer, within a top conductive plate, or within a tapered liner between a tapered via sidewall and a via plug contains either a phase change material or a top conductive material. The current density of the local structure around the current constricting layer is higher than the surrounding area, thus allowing local temperature to rise higher than surrounding material. The total current required to program the phase change memory device, and consequently the size of a programming transistor, is reduced due to the current constricting layer. Further, the self-assembly feature of the nanoparticles provide a tight resistance distribution for the phase change memory device.

According to an embodiment of the present invention, a semiconductor structure comprises:
  a phase change material layer;
  a current constricting layer abutting the phase change material layer and containing a monolayer of insulating nanoparticles embedded in and separated by a volume of a conductive material;
  a first conductive plate abutting the current constricting layer and comprising another volume of the conductive material; and
  a second conductive plate abutting the phase change material layer and disjoined from the first conductive plate.

The first conductive plate may be a top conductive plate and the second conductive plate may be a bottom conductive plate. Alternatively, the first conductive plate may be a bottom plate and the second conductive plate may be a top plate.

According to another embodiment of the present invention, a semiconductor structure comprises:

a first conductive plate comprising a first conductive material;
   a phase change material layer abutting the first conductive plate and comprising a phase change material;
   a current constricting layer comprising a set of disjoined insulating layer islands in a planar arrangement, wherein each of the disjoined insulating layer islands is embedded in and separated by a volume of material selected from the phase change material and the first conductive material, has a lateral dimension of a nanoparticle, and directly contacts the first phase change material layer;
   a second conductive plate comprising a second conductive material and resistively connected to the phase change material layer through the current constricting layer.

The second conductive plate may abut the current constricting layer. Alternatively, the semiconductor structure may further comprise another phase change material layer consisting of another volume of the phase change material and abutting the current constricting layer and the second conductive plate.

The disjoined insulating layer islands has a thickness ranging from about 3 nm to about 60 nm and comprises a material selected from the group consisting of silicon oxide, silicon nitride, aluminum oxide, aluminum nitride, silicon carbide, titanium oxide, tantalum oxide, ruthenium oxide, tungsten oxide, zinc oxide, silicon, germanium, germanium oxide, carbon, and a combination thereof.

According to yet another embodiment of the present invention, the semiconductor structure comprises:

a dielectric layer containing a tapered via hole sidewall;
   a tapered via liner abutting the tapered via hole sidewall and having a liner bottom surface and containing a monolayer of insulating nanoparticles that are embedded in and separated by a volume of a conductive material;
   a conductive via plug abutting the tapered via liner and comprising the conductive material;
   a phase change material layer abutting the liner bottom surface and the dielectric layer; and
   a bottom conductive plate abutting the phase change material layer.

According to a further embodiment of the present invention, the semiconductor comprises:

a top conductive plate;
   a dielectric layer abutting the top conductive plate and containing a tapered via hole sidewall;
   a tapered via liner abutting the tapered via hole sidewall and having a liner bottom surface and containing insulating nanoparticles that are embedded in and separated by a volume of a phase change material;
   a via plug consisting of another volume of the phase change material and encapsulated by the tapered via liner and the top conductive plate; and
   a bottom conductive plate resistively connected to the top plate through the tapered via.

The bottom conductive plate may abut the liner bottom surface and the dielectric layer. Alternatively, the semiconductor structure may further comprise a phase change material layer consisting of yet another volume of the phase change material, wherein the phase change material layer abuts the liner bottom surface, the dielectric layer, and the bottom conductive plate.

Within the various exemplary semiconductor structures, the insulating nanoparticles may comprise a dielectric material selected from the group consisting of silicon oxide, silicon nitride, aluminum oxide, aluminum nitride, silicon carbide, titanium oxide, tantalum oxide, ruthenium oxide, tungsten oxide, zinc oxide, silicon, germanium, germanium oxide, carbon, and a combination thereof.

Alternatively, each of the nanoparticles may be an organic molecule confined within a monolayer or a multilayer and having a characteristic dimension in the range from about 3 nm to about 24 nm, the characteristic dimension being selected from the group consisting of a full length, a full width, and a diameter.

A phase change material that can be employed herein includes, but is not limited to, a chalcogenide alloy, which is an alloy of a chalcogen element with at least one non-chalcogen element, wherein the chalcogen element is selected from the group consisting of Te, Se, and S, and the at least one non-chalcogen element is selected from the group consisting of Ge, Sb, Bi, Pb, Sn, As, Si, P, Ga, In, and Ag.

The various conductive plates and the conductive plug may comprise a material selected from the group consisting of Ti, Ta, W, Mo, Al, Cu, Pt, Ir, La, Ni, Ru, another elementary metal, and alloys thereof.

DETAILED DESCRIPTION OF THE INVENTION

Figure 1:
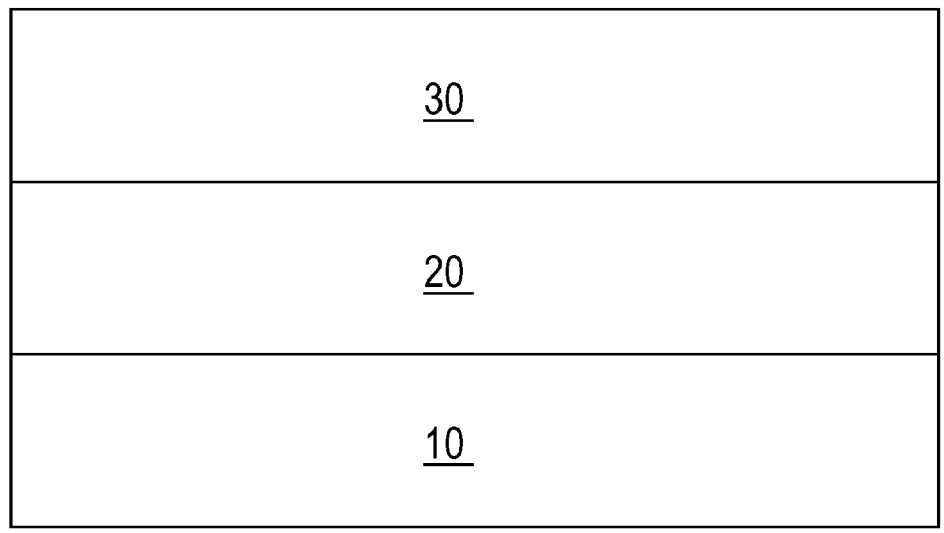
FIGS. 1 and 2 are cross-sectional views of prior art phase change memory element structures.
Figure 2:
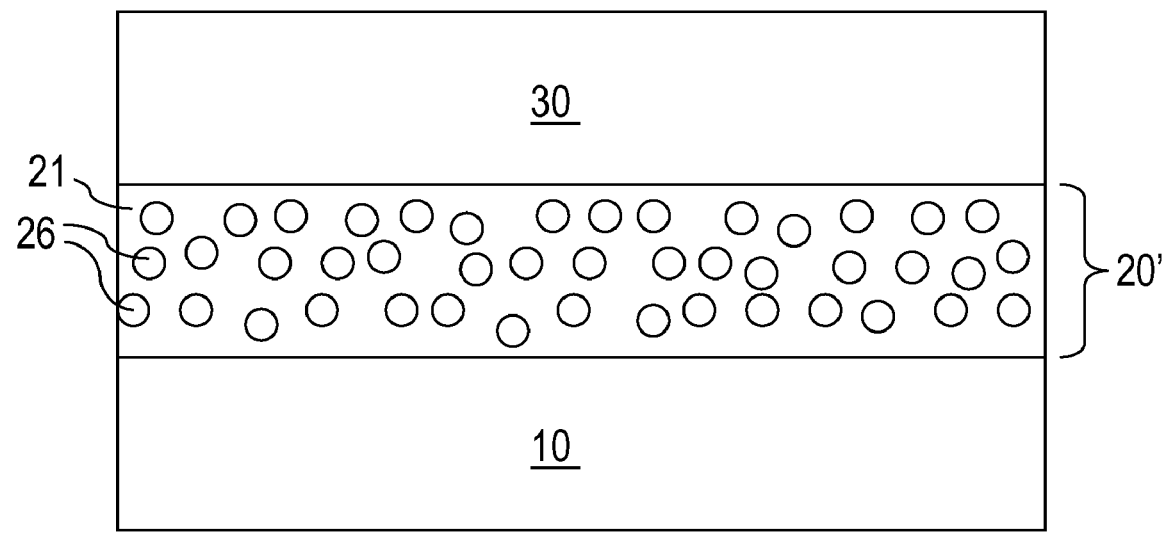

As stated above, the present invention relates to phase change memory (PCM) element structures having a current constricting layer and methods of manufacturing the same, which are now described in detail with accompanying figures. It is noted that like and corresponding elements are referred to by like reference numerals.

Figure 3A:
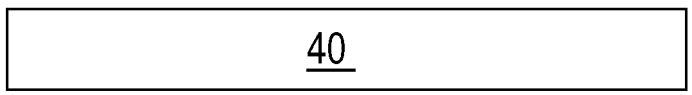
FIGS. 3A-3F are sequential cross-sectional views of a first exemplary phase change memory element structure according to a first embodiment of the present invention.

Sequential cross-sectional views of a first exemplary structure according to a first embodiment of the present invention are shown at various stages of a manufacturing process in FIGS. 3A-3F. Referring to FIG. 3A, a bottom conductive plate 40 is formed on an underlying semiconductor structure (not shown). The bottom conductive plate 40 may be formed by chemical vapor deposition or sputtering of a metal layer. Methods of placing the bottom conductive plate 40 in a semiconductor structure for the purpose of forming a PCM memory element is well known in the art. The bottom conductive plate 40 comprises a conductive material that may be, for example, selected from Ti, Ta, W, Mo, Al, Cu, Pt, Ir, La, Ni, Ru, another elemental metal, and alloys thereof. The thickness of the bottom conductive plate 40 is typically in the range from about 10 nm to about 80 nm.

Figure 3B:
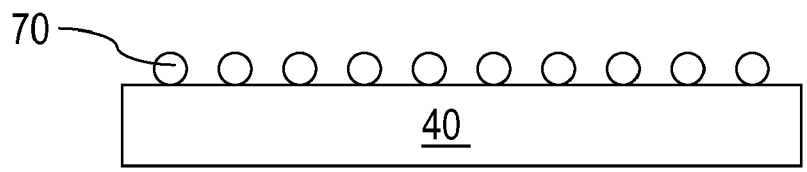

Referring to FIG. 3B, a monolayer of insulating nanoparticles 70 is applied to a top surface of the bottom conductive plate 40. Each of the insulating nanoparticles 70 may be an organic molecule confined within the monolayer and may be substantially spherical having a diameter in the range from about 1 nm to about 24 nm. The organic molecule may be, for example, a protein molecule. The organic molecule may also be ellipsoidal, superellipsoidal, or polyhedral and have a characteristic dimension in the range from about 1 nm to about 24 nm. The characteristic dimension may a full length, a full width, or a diameter of the insulating nanoparticles 70. Yamashita, "Big Nano Process: Fabrication of Nanoelectronic Devices using Protein Supermolecules," IEEE International Electron Devices Meeting, 1-4244-0439-Aug. 6, 2006 demonstrates that protein nanoparticles may be formed on a surface in self-alignment, thus forming a layer with regular arrangement in a monolayer. In other words, the density of the organic nanoparticles may be constant in a self-aligned monolayer. The organic nanoparticles are insulating and, preferably, self-planarizing as well.

Alternatively, the insulating nanoparticles 70 may comprise a dielectric material such as silicon oxide, silicon nitride, aluminum oxide, aluminum nitride, silicon carbide, titanium oxide, tantalum oxide, ruthenium oxide, tungsten oxide, zinc oxide, silicon, germanium, germanium oxide, carbon, and a combination thereof. The insulating nanoparticles 70 may be substantially spherical, ellipsoidal, superellipsoidal, or polyhedral and have a characteristic dimension ranging from 1 nm to about 24 nm. The characteristic dimension may be a diameter, a full width, or a full length. The insulating nanoparticles 70 may be formed, for example, by sputtering of a dielectric material target in a sputtering chamber.

Preferably, the insulating nanoparticles 70 are self-aligning and/or self-planarizing on the top surface of the bottom conductive plate 40. The monolayer of insulating nanoparticles 70 are separated among one another so that gaps are present among the insulating nanoparticles 70 when viewed from above. The gaps may be contiguous or many be disjoined among one another.

Figure 3C:
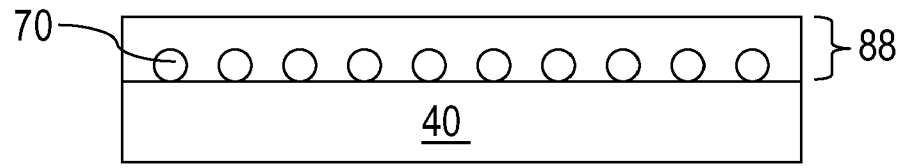

Referring to FIG. 3C, a conductive material layer 88 is deposited on the monolayer of the insulating particles 70 and on the portion of the bottom conductive plate 70 underneath the gaps between the insulating nanoparticles 70. The conductive material layer 88 comprises a conductive material, and preferably the same material as the conductive material of the bottom conductor plate 40. A volume of the conductive material layer 88 fills the gaps between the insulating nanoparticles 70. The thickness of the conductive material layer 88 is greater than the height of the monolayer of the insulating particles 70, and may be from about 6 nm to about 60 mm.

Figure 3D:
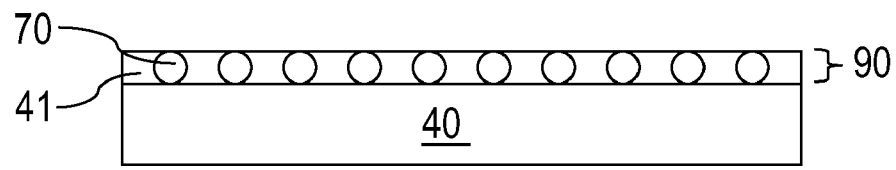

Referring to FIG. 3D, the conductive material layer 88 is etched to remove the portion above the monolayer of insulating nanoparticles 70. The monolayer of insulating nanoparticles 70 and the remaining volume 41 of the conductive material layer 88 form a current constricting layer 90. The current constricting layer 90 abuts the bottom conductive plate 40 and contains the monolayer of insulating nanoparticles 90 which are embedded in and separated by the remaining volume 41 of the conductive material layer 88. The composition of the current constricting layer 90 is substantially uniform, providing a uniform resistance across the current constriction layer 90, if the insulating nanoparticles 70 are uniformly distributed in the monolayer at the time of application.

Figure 3E:
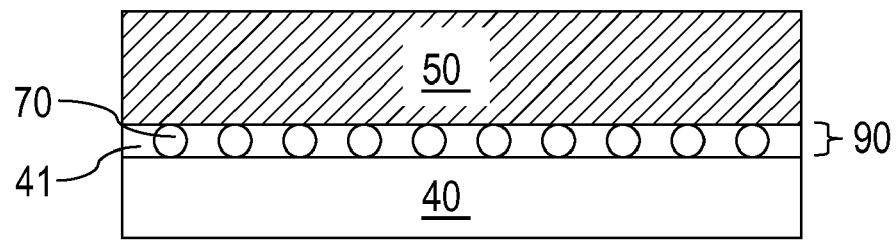

Referring to FIG. 3E, a phase change material layer 50 is formed directly on the current constricting layer 90, for example, by chemical vapor deposition or sputtering. The phase change material layer 50 comprises a phase change material, which includes, but is not limited to, a chalcogenide alloy, or an alloy of a chalcogen element with at least one non-chalcogen element, wherein the chalcogen element is selected from the group consisting of Te, Se, and S, and the at least one non-chalcogen element is selected from the group consisting of Ge, Sb, Bi, Pb, Sn, As, Si, P, Ga, In, and Ag. Illustrative examples of such chalcogenide alloys are GaSb, InSb, InSe, $Sb_2Te_3$, GeTe, $Ge_2Sb_2Te_5$, InSbTe, GaSbTe, $SnSb_2Te_4$, InSbGe, AgInSbTe, (GeSn)SbTe, GeSb(SeTe), $Te_{81}Ge_{15}Sb_2S_2$, and compounds with modified atomic ratios thereof. The thickness of the phase change material layer 50 is from about 10 nm to about 100 nm, and may be optimized for optimal performance of the PCM element.

Figure 3F:
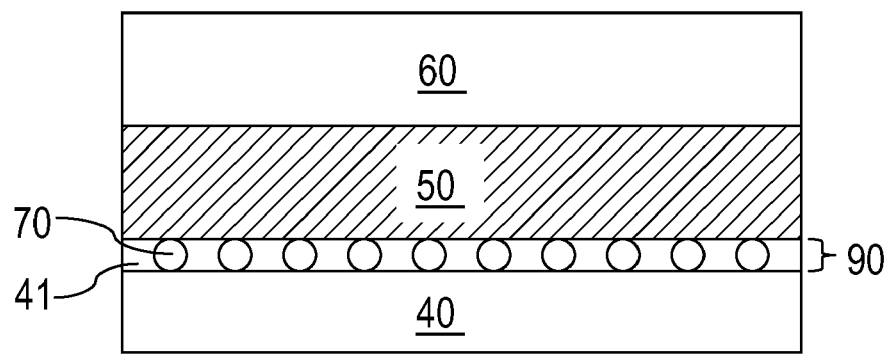

Referring to FIG. 3F, a top conductive plate 60 is formed directly on the phase change material layer 50, for example, by chemical vapor deposition or sputtering. The top conductive plate 60 comprises a conductive material that may be, for example, a material selected from Ti, Ta, W, Mo, Al, Cu, Pt, Ir, La, Ni, Ru, another elementary metal, and alloys thereof. The thickness of the top conductive plate 60 is typically from about 10 nm to about 80 nm. The top conductive plate 60 and the bottom conductive plate 40 may comprise the same, or different material.

Figure 4A:
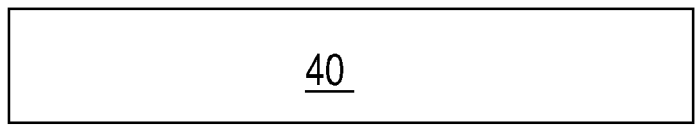
FIGS. 4A-4D are sequential cross-sectional views of a second exemplary phase change memory element structure according to a second embodiment of the present invention.

Sequential cross-sectional views of a second exemplary structure according to a second embodiment of the present invention are shown at various stages of a manufacturing process in FIGS. 4A-4D. Referring to FIG. 4A, a bottom conductive plate 40 is formed on an underlying semiconductor structure (not shown) as in the first embodiment.

Figure 4B:
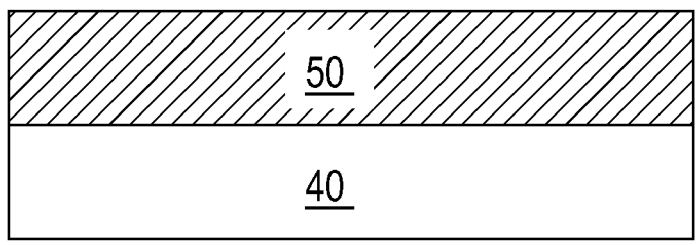

Referring to FIG. 4B, a phase change material layer 50 is formed directly on the bottom conductive plate 40. The physical characteristics of the phase change material layer 50 are the same as in the first embodiment.

Figure 4C:
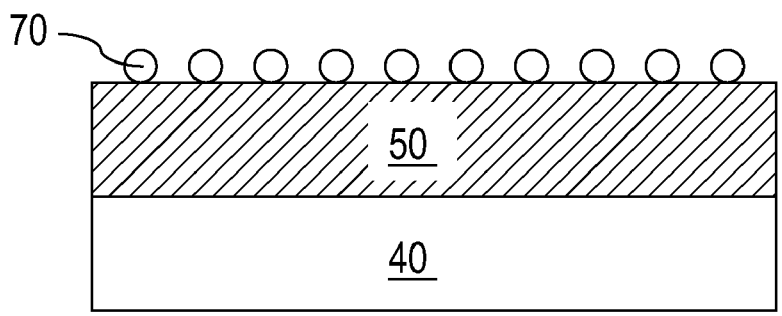

Referring to FIG. 4C, a monolayer of insulating nanoparticles 70 is applied to a top surface of the phase change material layer 50. The same type of insulating nanoparticles 70 may be employed as in the first embodiment. Preferably, the insulating nanoparticles 70 are self-aligning and/or self-planarizing on the top surface of the phase change material layer 50. The monolayer of insulating nanoparticles 70 are separated among one another so that gaps are present among the insulating nanoparticles 70 when viewed from above. The gaps may be contiguous or many be disjoined among one another.

Figure 4D:
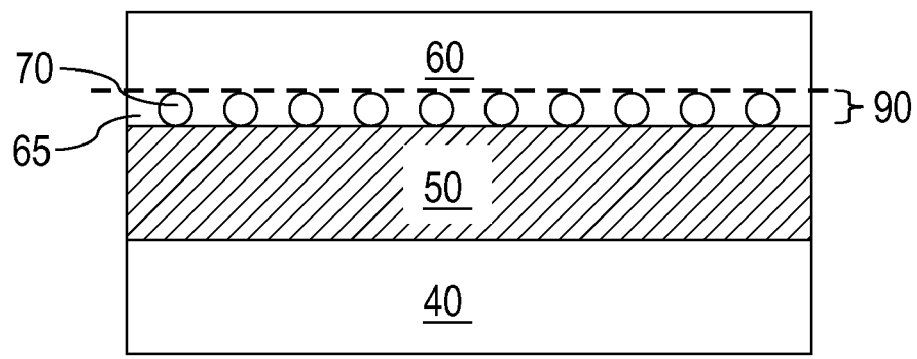

Referring to FIG. 4D, a conductive material is deposited on the monolayer of the insulating particles 70 and on the portion of the phase change material layer 50 in the gaps between the insulating particles 70. The conductive material may be any of the material listed for the bottom conductive plate 40 and the top conductive plate 60 in the first embodiment. A volume 65 of the conductive material fills the gaps between the monolayer of insulating nanoparticles 70. The volume 65 of the conductive material and the monolayer of insulating particles 70 form a current constriction layer 90. The thickness of the current constriction layer 90 is the same as the height of the monolayer of insulating particles 70.

A top conductive plate 60 comprises another volume of the conductive material formed directly above the current constriction layer 90. The thickness of the top conductive plate 60 is typically from about 10 nm to about 80 nm. The top conductive plate 60 and the bottom conductive plate 40 may comprise the same, or different, material. The current constriction layer 90 abuts both the phase change material layer 50 and the top conductive layer 60. The volume 65 of the conductive material between the monolayer of insulating nanoparticles 70 and the another volume of the conductive material in the top conductive plate 60, which is located above a top surface of the monolayer of insulating particles 70 represented by a dotted line in FIG. 4D, are inherently adjoined.

Sequential cross-sectional views of a third exemplary structure according to a third embodiment of the present invention are shown at various stages of a manufacturing process in FIGS. 5A-5F. Referring to FIG. 4A, a bottom conductive plate 40 is formed on an underlying semiconductor structure (not shown) as in the first embodiment.

Figure 5A:
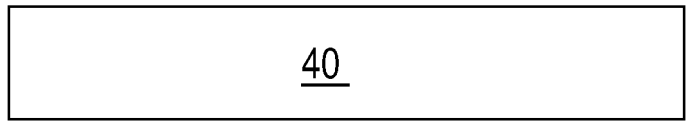
FIGS. 5A-5F are sequential cross-sectional views of a third exemplary phase change memory element structure according to a third embodiment of the present invention.
Figure 5B:
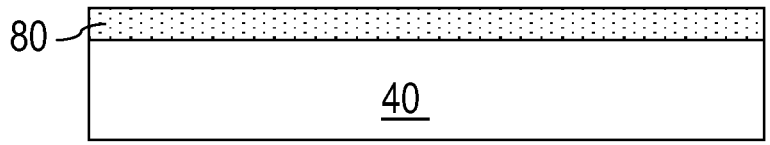

Referring to FIG. 5B, an insulating layer 80 is formed on the bottom conductive layer 40, for example, by chemical vapor deposition. The insulating layer 80 comprises an insulating material such as silicon oxide, silicon nitride, aluminum oxide, aluminum nitride, silicon carbide, titanium oxide, tantalum oxide, ruthenium oxide, tungsten oxide, zinc oxide, silicon, germanium, germanium oxide, carbon, or a combination thereof. The insulating layer 80 may be formed by deposition such as chemical vapor deposition. The thickness of the insulating layer 80 may be from about 3 nm to about 60 nm.

Figure 5C:
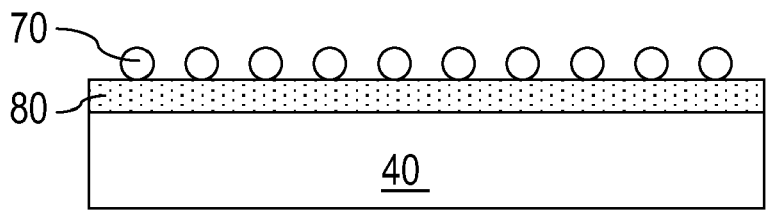

Referring to FIG. 5C, a monolayer of insulating nanoparticles 70 is applied to a top surface of the insulating layer 80. The same type of insulating nanoparticles 70 may be employed as in the first embodiment. Preferably, the insulating nanoparticles 70 are self-aligning and/or self-planarizing on the top surface of the insulating layer 50. The monolayer of insulating nanoparticles 70 are separated among one another so that gaps are present among the insulating nanoparticles 70 when viewed from above. The gaps may be contiguous or many be disjoined among one another.

Figure 5D:
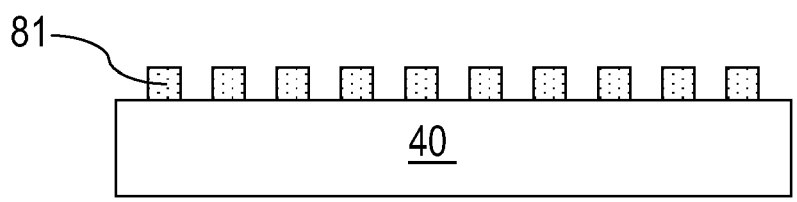

Referring to FIG. 5D, an anisotropic reactive ion etch is performed on the insulating layer 80 employing the monolayer of insulating nanoparticles 70 as hardmasks. During the anisotropic reactive ion etch, the portions of the insulating layer 80 under the gaps between the insulating nanoparticles 70 are etched and removed while the remaining portions of the insulating layer 80 that are located directly underneath the insulating nanoparticles 70 are shadowed from reactive ions by the insulating nanoparticles 70 during the anisotropic reactive ion etch. Consequently, a set of disjoined insulating layer islands 81 are formed by the anisotropic reactive ion etch. The insulating nanoparticles are preferably consumed during the anisotropic reactive ion etch. The set of the disjoined insulating islands 81 is in a planar arrangement. The thickness of the disjoined insulating islands 81 may be from about 3 nm to about 60 nm.

Figure 5E:
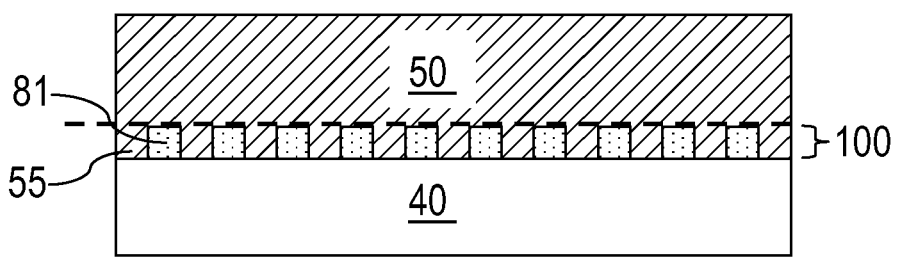

Referring to FIG. 5E, a phase change material is deposited on the set of the disjoined insulating islands 81 and on the portion of the bottom conductive plate 40 underneath the gaps between the insulating particles 70. The phase change material may be any of the material listed for the phase change material layer 50 in the first embodiment. A volume 55 of the phase change material fills the gaps among the disjoined insulating islands 81. The volume 55 of the phase change material and the set of the disjoined insulating islands 81 form a current constriction layer 100. The thickness of the current constriction layer 100 is the same as the height of the set of the disjoined insulating islands 81.

Another volume of the phase change material forms a phase change material layer 50 directly above the current constriction layer 100. The thickness of the phase change material layer 50 is typically from about 10 nm to about 100 nm. The current constriction layer 100 abuts both the phase change material layer 50 and the bottom conductive layer 40. The volume 55 of the phase change material between the disjoined insulating islands 81 and the another volume of the phase change material in the phase change material layer 50 are inherently adjoined. The boundary between the current constriction layer 100 and the phase change material layer 50 is represented by a dotted line in FIG. 5E.

Figure 5F:
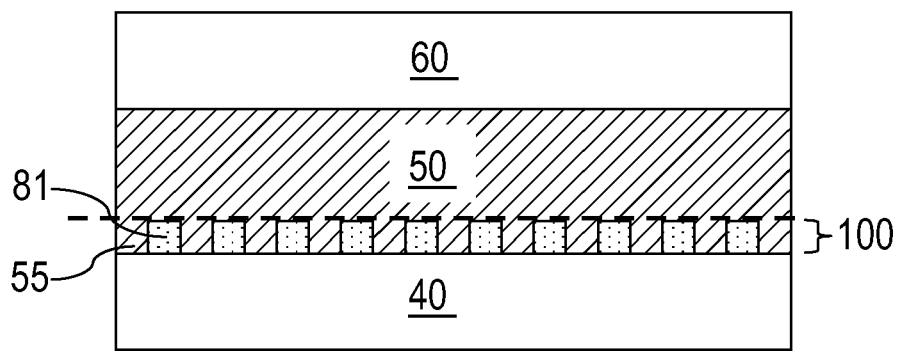

Referring to FIG. 5F, a top conductive plate 60 is formed by depositing a conductive material directly on the phase change material layer 50. The conductive material may be any of the material listed for the bottom conductive plate 40 and the top conductive plate 60 in the first embodiment. The thickness of the top conductive plate 60 is typically in the range from about 10 nm to about 80 nm. The top conductive plate 60 and the bottom conductive plate 40 may comprise the same, or different, material.

Figure 6A:
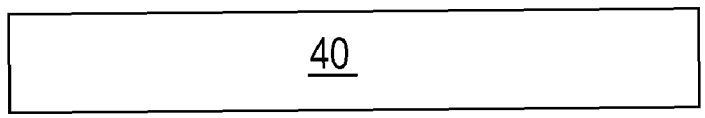
FIGS. 6A-6G are sequential cross-sectional views of a fourth exemplary phase change memory element structure according to a fourth embodiment of the present invention.

Sequential cross-sectional views of a fourth exemplary structure according to a fourth embodiment of the present invention are shown at various stages of a manufacturing process in FIGS. 6A-6H. Referring to FIG. 6A, a bottom conductive plate 40 is formed on an underlying semiconductor structure (not shown) as in the first embodiment.

Figure 6B:
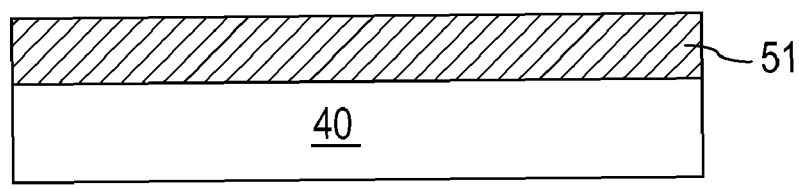

Referring to FIG. 6B, a first phase change material is deposited on the bottom conductive layer 40 to form a first phase change material layer 51. The first phase change material may be any of the material listed for the phase change material layer 50 in the first embodiment. The thickness of the first phase change material layer 51 is typically in the range from about 5 nm to about 50 nm.

Figure 6C:
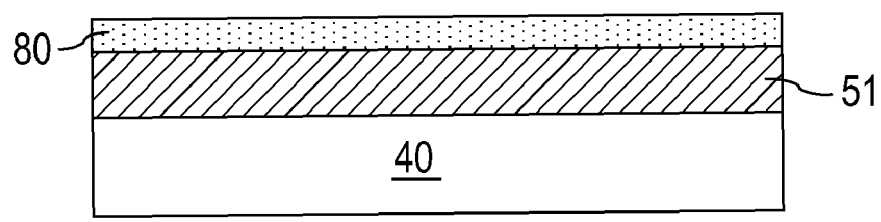

Referring to FIG. 6C, an insulating layer 80 is formed on the first phase change material layer 51, for example, by chemical vapor deposition. The insulating layer 80 is formed by the same method as and comprises the same material as the insulating layer 80 according to the third embodiment. The thickness of the insulating layer 80 may be from about 3 nm to about 60 nm.

Figure 6D:
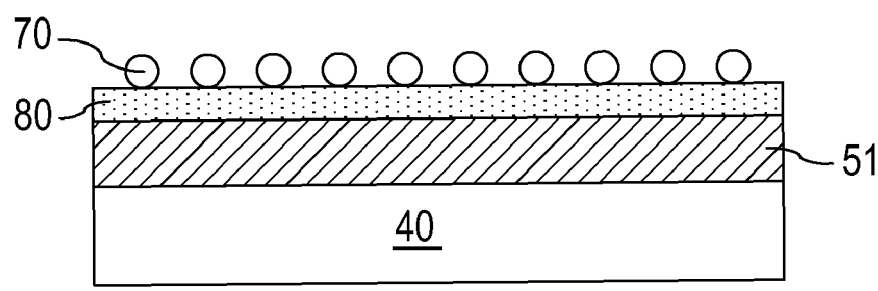

Referring to FIG. 6D, a monolayer of insulating nanoparticles 70 is applied to a top surface of the insulating layer 80. The same type of insulating nanoparticles 70 may be employed as in the first embodiment. Preferably, the insulating nanoparticles 70 are self-aligning and/or self-planarizing on the top surface of the insulating layer 80. The monolayer of insulating nanoparticles 70 are separated among one another so that gaps are present among the insulating nanoparticles 70 when viewed from above. The gaps may be contiguous or many be disjoined among one another.

Figure 6E:
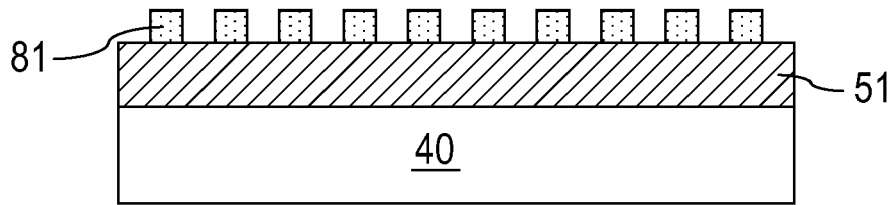

Referring to FIG. 6E, an anisotropic reactive ion etch is performed on the insulating layer 80 employing the monolayer of insulating nanoparticles 70 as hardmasks. A set of disjoined insulating layer islands 81 are formed by the anisotropic reactive ion etch in the same fashion as in the third embodiment of the present invention. The insulating nanoparticles 70 are preferably consumed during the anisotropic reactive ion etch. The set of the disjoined insulating islands 81 is in a planar arrangement. The thickness of the disjoined insulating islands 81 may be from about 3 nm to about 60 nm.

Figure 6F:
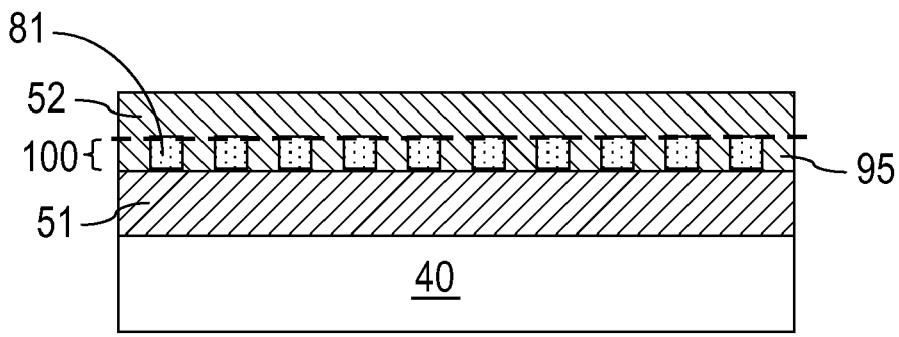

Referring to FIG. 6F, a second phase change material is deposited on the set of the disjoined insulating islands 81 and on the portion of the first phase change material layer 51 underneath the gaps between the insulating particles 70. The second phase change material may be any of the material listed for the phase change material layer 50 in the first embodiment. A volume 95 of the second phase change material fills the gaps among the disjoined insulating islands 81. The volume 95 of the second phase change material and the set of the disjoined insulating islands 81 form a current constriction layer 100. The thickness of the current constriction layer 100 is the same as the height of the set of the disjoined insulating islands 81.

Another volume of the second phase change material forms a second phase change material layer 51 directly above the current constriction layer 100. The thickness of the second phase change material layer 52 is typically from about 5 nm to about 50 nm. The current constriction layer 100 abuts both the first phase change material layer 51 and the second phase change material layer 52. The volume 95 of the second phase change material between the disjoined insulating islands 81 and the another volume of the second phase change material in the second phase change material layer 52 are inherently adjoined since both are formed during the same process step. The boundary between the current constriction layer 100 and the second phase change material layer 52 is represented by a dotted line in FIG. 6F. The first phase change material and the second phase change material may comprise the same or different material.

Figure 6G:
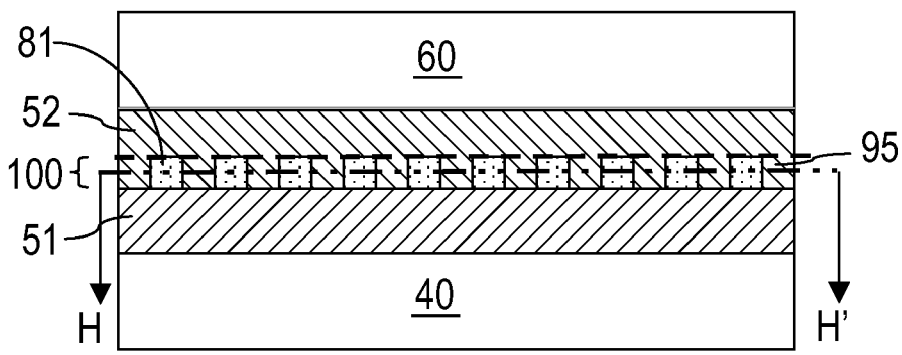

Referring to FIG. 6G, a top conductive plate 60 is formed by depositing a conductive material directly on the second phase change material layer 52. The conductive material may be any of the material listed for the bottom conductive plate 40 and the top conductive plate 60 in the first embodiment. The thickness of the top conductive plate 60 is typically from about 10 nm to about 80 nm. The top conductive plate 60 and the bottom conductive plate 40 may comprise the same, or different, material.

Figure 6H:
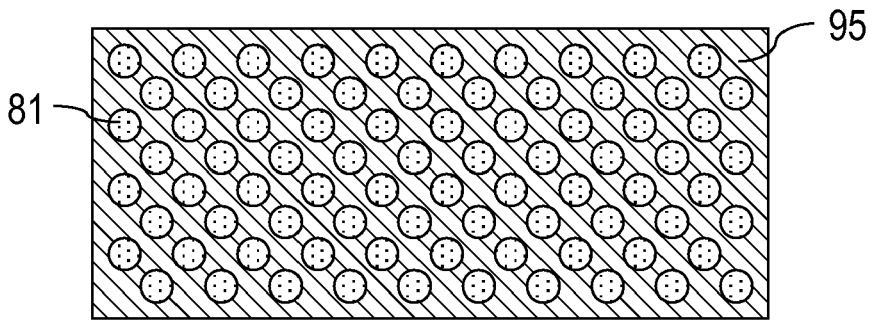
FIG. 6H is a horizontal cross-sectional view of the fourth exemplary structure in FIG. 6G in the plane H-H' in FIG. 6G.

Referring to FIG. 6H, a horizontal cross-sectional view of the fourth exemplary structure along the plane H-H' in FIG. 6G shows the set of the disjoined insulating islands 81 within the current constriction layer 100 are disjoined, or separated among one another by the volume 95 of the second phase change material within the current constriction layer 100.

Figure 7A:
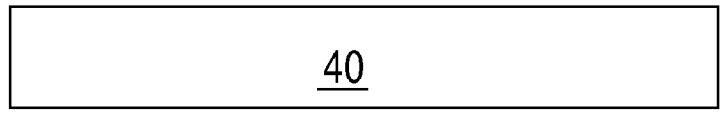
FIGS. 7A-7F are sequential cross-sectional views of a fifth exemplary phase change memory element structure according to a fifth embodiment of the present invention.

Sequential cross-sectional views of a fifth exemplary structure according to a fifth embodiment of the present invention are shown at various stages of a manufacturing process in FIGS. 7A-7F. Referring to FIG. 7A, a bottom conductive plate 40 is formed on an underlying semiconductor structure (not shown) as in the first embodiment.

Figure 7B:
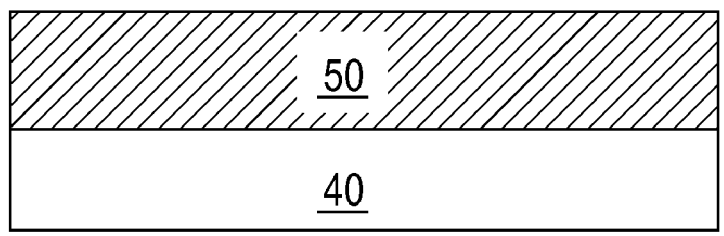

Referring to FIG. 7B, a phase change material is deposited on the bottom conductive layer 40 to form a phase change material layer 50. The phase change material may be any of the material listed for the phase change material layer 50 in the first embodiment. The thickness of the phase change material layer 50 is typically from about 10 nm to about 100 nm.

Figure 7C:
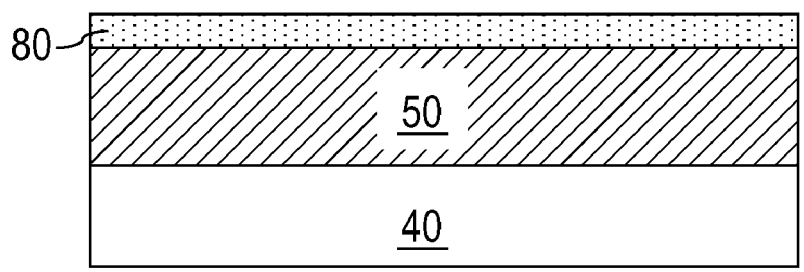

Referring to FIG. 7C, an insulating layer 80 is formed on the phase change material layer 50, for example, by chemical vapor deposition. The insulating layer 80 is formed by the same method as and comprises the same material as the insulating layer 80 according to the third embodiment. The thickness of the insulating layer 80 may be from about 3 nm to about 60 nm.

Figure 7D:
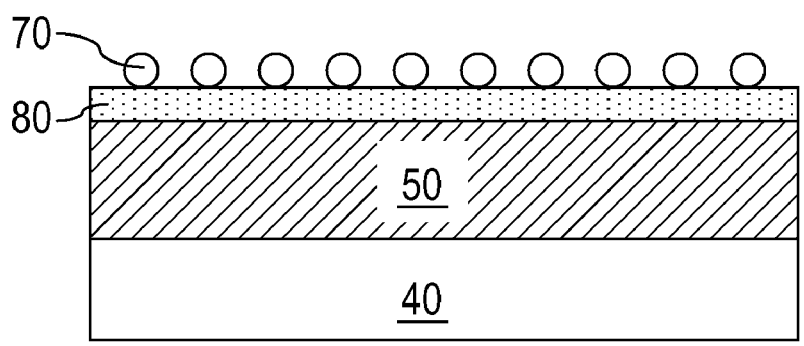

Referring to FIG. 7D, a monolayer of insulating nanoparticles 70 is applied to a top surface of the insulating layer 80. The same type of insulating nanoparticles 70 may be employed as in the first embodiment. Preferably, the insulating nanoparticles 70 are self-aligning and/or self-planarizing on the top surface of the insulating layer 80. The monolayer of insulating nanoparticles 70 are separated among one another so that gaps are present among the insulating nanoparticles 70 when viewed from above. The gaps may be contiguous or many be disjoined among one another.

Figure 7E:
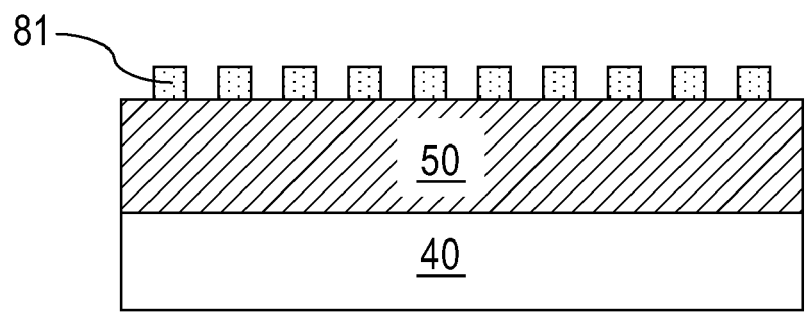

Referring to FIG. 7E, an anisotropic reactive ion etch is performed on the insulating layer 80 employing the monolayer of insulating nanoparticles 70 as hardmasks. A set of disjoined insulating layer islands 81 are formed by the anisotropic reactive ion etch in the same fashion as in the third embodiment of the present invention. The insulating nanoparticles 70 are preferably consumed during the anisotropic reactive ion etch. The set of the disjoined insulating islands 81 is in a planar arrangement. The thickness of the disjoined insulating islands 81 may be from about 3 nm to about 60 nm.

Figure 7F:
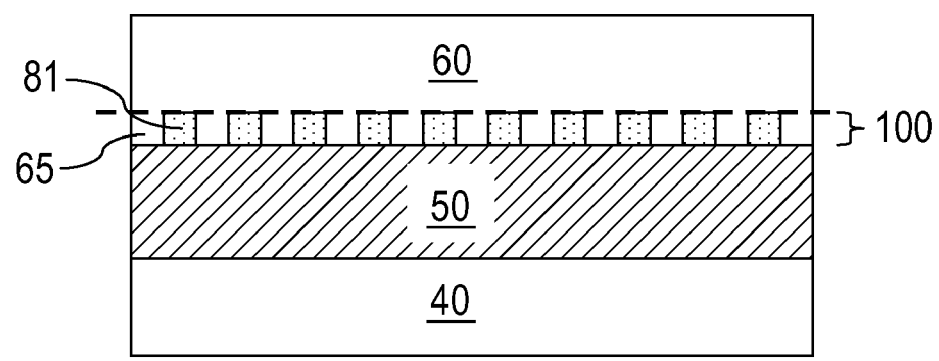

Referring to FIG. 7F, a conductive material is deposited on the set of the disjoined insulating islands 81 and on the portion of the phase change material layer 50 underneath the gaps between the insulating particles 70. The conductive material may be any of the material listed for the bottom conductive plate 40 and the top conductive plate 60 in the first embodiment. A volume 65 of the conductive material fills the gaps among the disjoined insulating islands 81. The volume 65 of the conductive material and the set of the disjoined insulating islands 81 form a current constriction layer 100. The thickness of the current constriction layer 100 is the same as the height of the set of the disjoined insulating islands 81.

Another volume of the conductive material forms a top conductive plate 60 directly above the current constriction layer 100. The thickness of the top conductive plate 60 is typically from about 10 nm to about 80 nm. The top conductive plate 60 and the bottom conductive plate 40 may comprise the same, or different, material. The current constriction layer 100 abuts both the phase change material layer 50 and the top conductive plate 60. The volume 65 of the conductive material between the disjoined insulating islands 81 and the another volume of the conductive material in the top conductive plate 60 are inherently adjoined since both are formed during the same process step. The boundary between the current constriction layer 100 and the top conductive plate 60 is represented by a dotted line in FIG. 7F.

Sequential cross-sectional views of a sixth exemplary structure according to a sixth embodiment of the present invention are shown at various stages of a manufacturing process in FIGS. 8A-8H. Referring to FIG. 5A, a bottom conductive plate 40 is formed on an underlying semiconductor structure (not shown) as in the first embodiment.

Figure 8A:
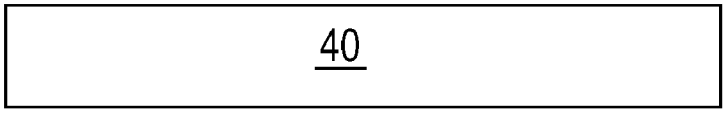
FIGS. 8A-8H are sequential cross-sectional views of a sixth exemplary phase change memory element structure according to a sixth embodiment of the present invention.
Figure 8B:
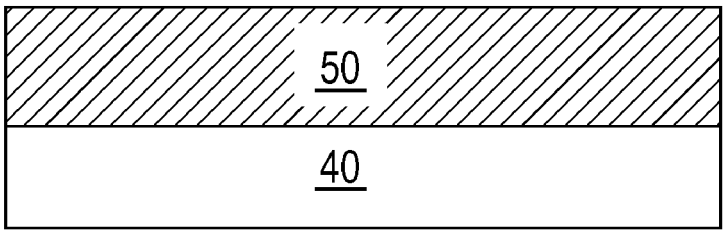
Figure 8C:
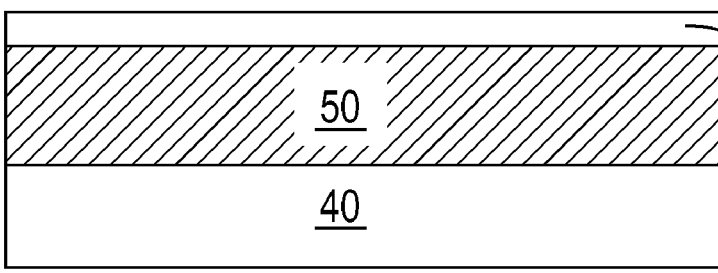

Referring to FIG. 8B, a phase change material is deposited on the bottom conductive layer 40 to form a phase change material layer 50. The phase change material may be any of the material listed for the phase change material layer 50 in the first embodiment. The thickness of the phase change material layer 50 is typically from about 10 nm to about 100 nm.

Referring to FIG. 5C, a conductive material layer 62 is formed on the phase change material layer 50, for example, by chemical vapor deposition. The conductive material layer 62 comprises the same material as the bottom conductive plate 40 and the top conductive plate 60 according to the first embodiment. The thickness of the conductive material layer 62 may be from about 3 nm to about 60 nm.

Figure 8D:
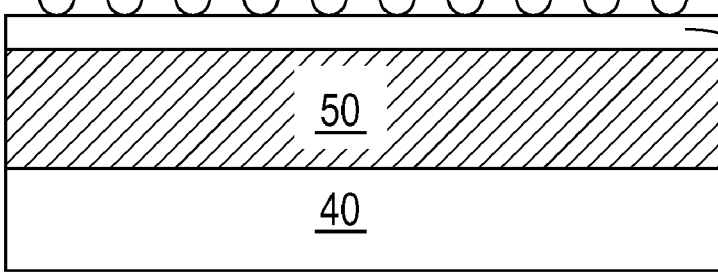
Figure 8E:
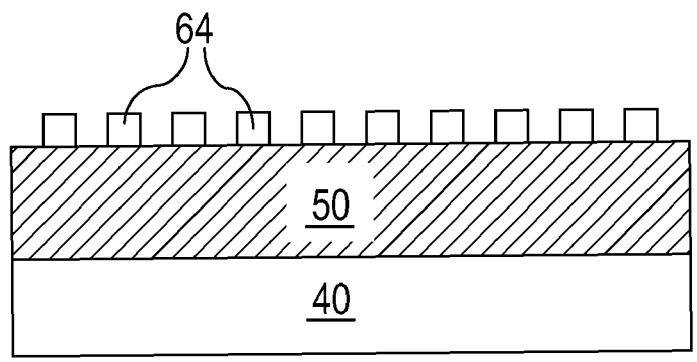
Figure 8F:
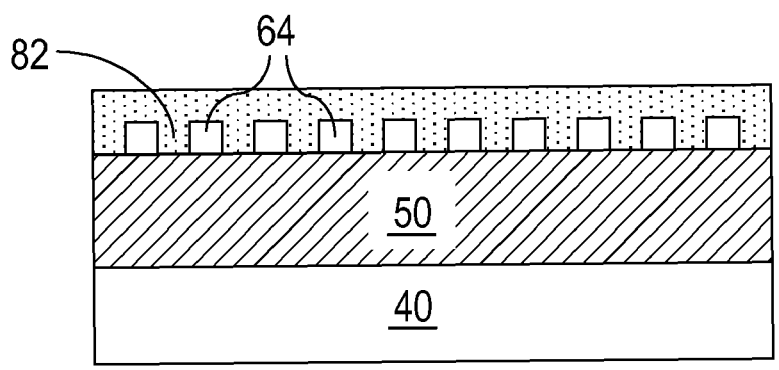

Referring to FIG. 8D, a monolayer of insulating nanoparticles 70 is applied to a top surface of the conductive material layer 62. The same type of insulating nanoparticles 70 may be employed as in the first embodiment. Preferably, the insulating nanoparticles 70 are self-aligning and/or self-planarizing on the top surface of the conductive material layer 62. The monolayer of insulating nanoparticles 70 are separated among one another so that gaps are present among the insulating nanoparticles 70 when viewed from above. The gaps may be contiguous or many be disjoined among one another.

Referring to FIG. 5E, an anisotropic reactive ion etch is performed on the conductive material layer 62 employing the monolayer of insulating nanoparticles 70 as hardmasks. During the anisotropic reactive ion etch, the portions of the conductive material layer 62 under the gaps between the insulating nanoparticles 70 are etched and removed while the remaining portions of the conductive material layer 62 that are located directly underneath the insulating nanoparticles 70 are shadowed from reactive ions by the insulating nanoparticles 70 during the anisotropic reactive ion etch. Consequently, a set of disjoined conductive layer islands 64 are formed by the anisotropic reactive ion etch. The insulating nanoparticles are preferably consumed during the anisotropic reactive ion etch. The set of the disjoined conducting islands 64 is in a planar arrangement. The thickness of the disjoined conducting islands 64 may be from about 3 nm to about 60 nm.

Referring to FIG. 5F, an insulating material layer 82 is deposited over the exposed portions of the phase change material layer 50 and on the top surfaces and sidewalls of the disjoined conducting islands 64. The thickness of the insulating material layer 82 is thicker than the disjoined conducting islands 64 and may be from about 6 nm to about 100 nm.

Figure 8G:
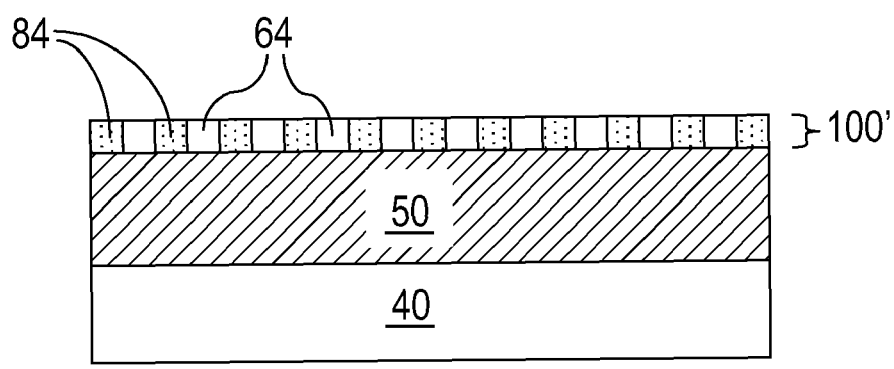

Referring to FIG. 8G, the portion of the insulating material layer 82 above the top surface of the disjoined conducting islands 64 is removed, for example, by a reactive ion etch or by other means of planarization such as chemical mechanical planarization (CMP). The disjoined conducting islands 64 and the remaining insulting material 84 between the disjoined conducting islands 64 collectively form a current constriction layer 100'.

Figure 8H:
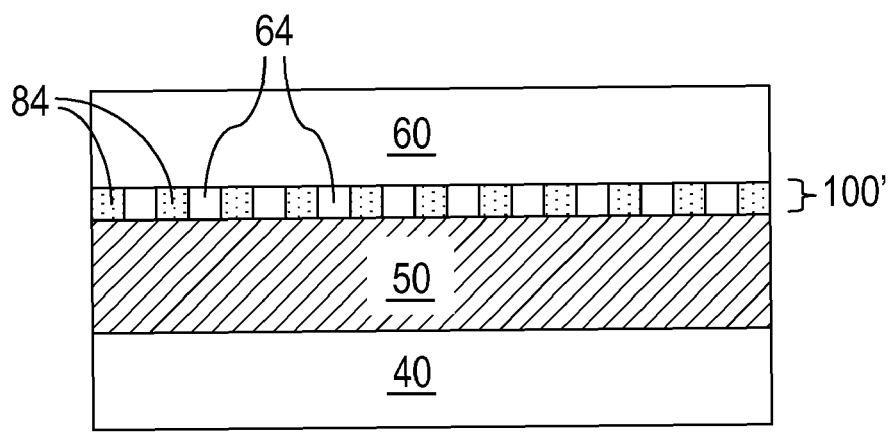

Referring to FIG. 8H, a top conductive plate 60 is formed by depositing a conductive material directly on the current constriction layer 100'. The conductive material may be any of the material listed for the bottom conductive plate 40 and the top conductive plate 60 in the first embodiment. The thickness of the top conductive plate 60 is typically from about 10 nm to about 80 nm. The top conductive plate 60 and the bottom conductive plate 40 may comprise the same, or different, material.

Figure 9:
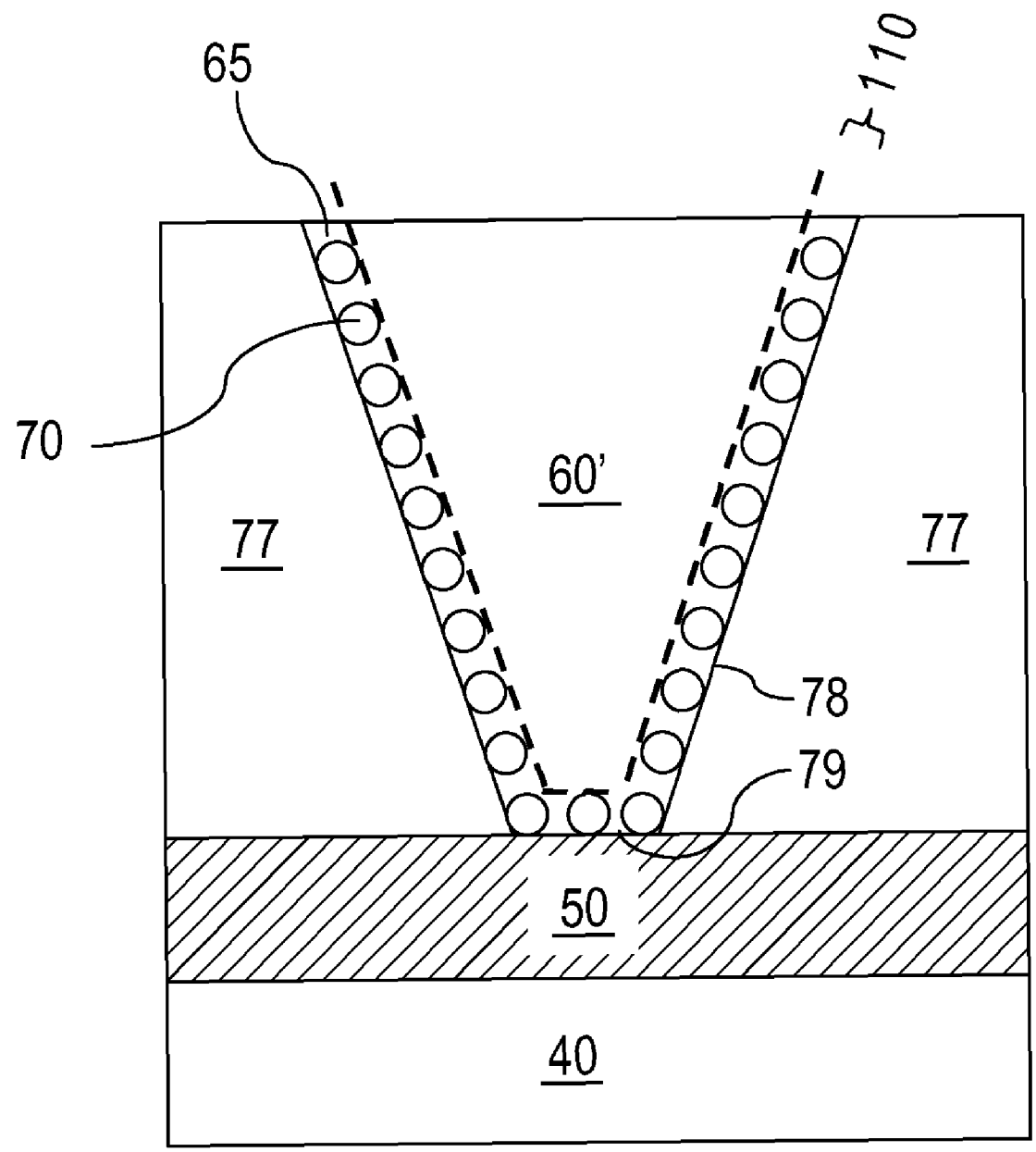
FIGS. 9-13 are seventh through eleventh exemplary phase change memory element structures according to seventh through eleventh embodiments of the present invention, respectively.

Referring to FIG. 9, a seventh exemplary structure according to a seventh embodiment of the present invention comprises a bottom conductive plate 40, a phase change material layer 50, a dielectric layer 77 containing a tapered via hole sidewall 78, a tapered via liner 110 having a liner bottom surface 79, and a conductive via plug 60'. The phase change material layer 50 abuts the bottom conductive plate 40 located underneath, the liner bottom surface 79, and the dielectric layer 77. The tapered via liner 110 abuts the tapered via hole sidewall 78 and contains a monolayer of insulating nanoparticles 70 that are embedded in and separated by a volume 65 of a conductive material. The conductive via plug 60' comprises the same conducive material as the volume 65 of the conductive material within the tapered via liner 110.

The bottom conductive plate 40 and the conductive via plug 60' comprise a conductive material that may be, for example, a material selected from Ti, Ta, W, Mo, Al, Cu, Pt, Ir, La, Ni, Ru, another elementary metal, and alloys thereof. The thickness of the bottom conductive plate 40 is typically in the range from about 10 nm to about 80 nm.

The phase change material layer 50 comprises a phase change material, which includes, but is not limited to, a chalcogenide alloy, or an alloy of a chalcogen element with at least one non-chalcogen element, wherein the chalcogen element is selected from the group consisting of Te, Se, and S, and the at least one non-chalcogen element is selected from the group consisting of Ge, Sb, Bi, Pb, Sn, As, Si, P, Ga, In, and Ag. Illustrative examples of such chalcogenide alloys are GaSb, InSb, InSe, $Sb_2Te_3$, GeTe, $Ge_2Sb_2Te_5$, InSbTe, GaSb Te, $SnSb_2Te_4$, InSbGe, AgInSbTe, (GeSn)SbTe, GeSb (SeTe), $Te_{81}Ge_{15}Sb_2S_2$, and compounds with modified atomic ratios thereof. The thickness of the phase change material layer 50 is in the range from about 10 nm to about 100 nm, and may be optimized for optimal performance of the PCM element.

The dielectric layer 77 comprises a dielectric material that may be, for example, a silicon oxide, silicon nitride, or other dielectric material that can withstand the temperature needed for melting the phase change material in the phase change material layer 50. The dielectric layer may have a thickness from about 50 nm to about 400 nm. A tapered via hole is formed on the dielectric layer 77 by lithographic patterning and etching of the dielectric layer 77. The tapered via hole has a tapered via hole sidewall 78 that may have a circular, elliptical, or a polygonal cross-sectional area. The opening at the bottom of the tapered via hole may have a lithographic dimension or a sub-lithographic dimension.

The conductive material of the conductive via plug 60' and the volume 65 of the conductive material within the tapered via liner 110 comprises a conductive material that may be, for example, a material selected from Ti, Ta, W, Mo, Al, Cu, Pt, Ir, La, Ni, Ru, another elementary metal, or alloys thereof. The conductive material of the conductive via plug 60' and the volume 65 of the conductive material within the tapered via liner 110 comprise the same material and are inherently adjoined because both are formed during the same processing step by deposition of the same conductive material. The boundary between the conductive material of the conductive via plug 60' and the volume 65 of the conductive material within the tapered via liner 110 is marked by a dotted line in FIG. 9.

Figure 10:
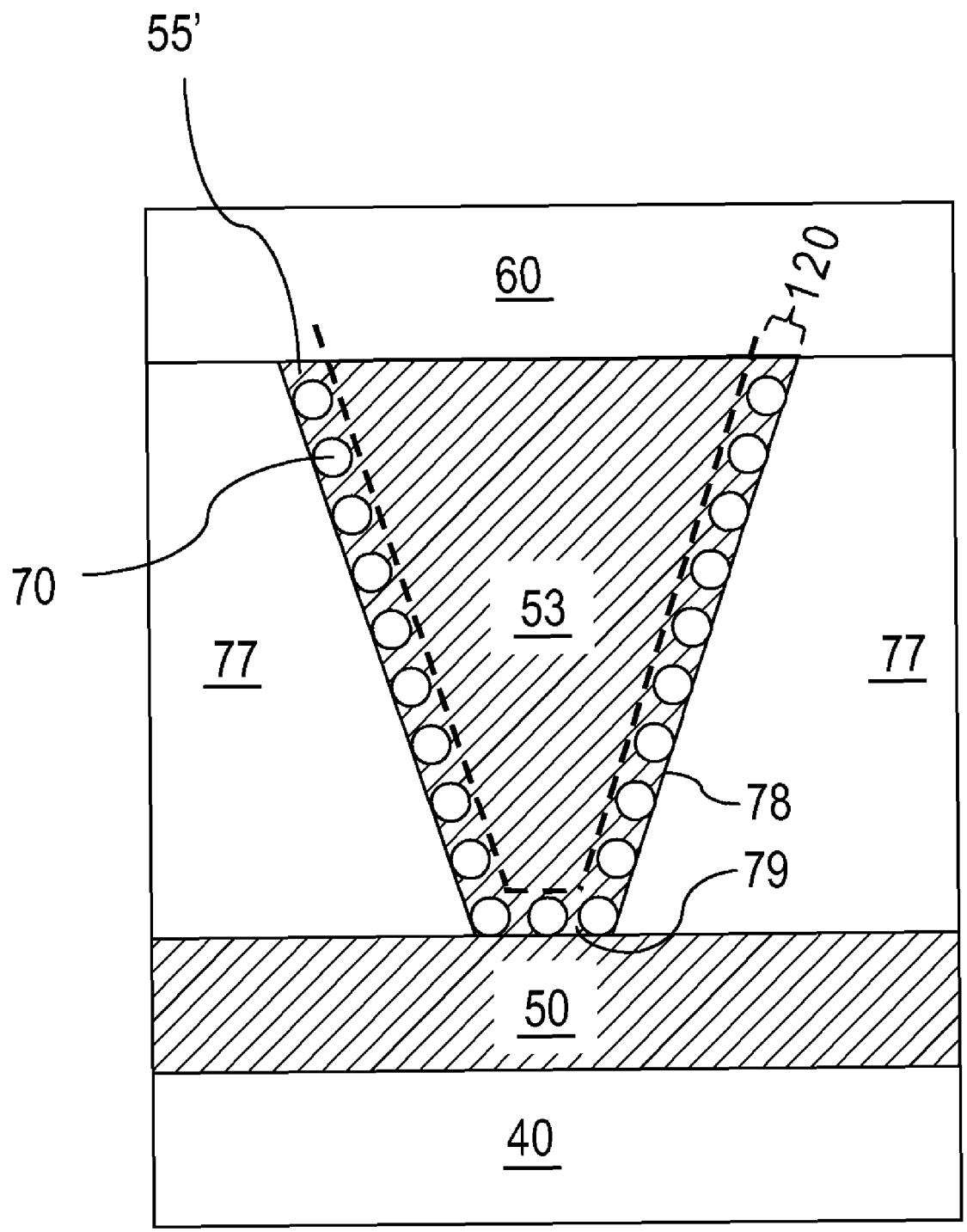

Referring to FIG. 10, an eighth exemplary structure according to an eighth embodiment of the present invention comprises a bottom conductive plate 40, a phase change material layer 50, a dielectric layer 77 containing a tapered via hole sidewall 78, a tapered via liner 120 having a liner bottom surface 79, a phase change material plug 53, and a top conductive plate 60. The phase change material layer 50 abuts the bottom conductive plate 40 located underneath, the liner bottom surface 79, and the dielectric layer 77. The tapered via liner 120 abuts the tapered via hole sidewall 78 and contains a monolayer of insulating nanoparticles 70 that are embedded in and separated by a volume 55' of a phase change material. The phase change material plug 53 comprises the same phase change material as the volume 55, of the phase change material within the tapered via liner 120. The top conductive plate 60 abuts the dielectric layer 77, the tapered via liner 120, and the phase change material plug 53.

The bottom conductive plate 40 and the top conductive plate 60 may comprise the same material as the bottom conductive plate 40 according to the seventh embodiment. The bottom conductive plate 40 and the top conductive plate 60 may or may not, have the same composition. The thickness of the bottom conductive plate 40 is typically from about 10 nm to about 80 nm. Also, the thickness of the top conductive plate 60 is typically in the range from about 10 nm to about 80 nm.

The phase change material layer 50 and the phase change material plug 53 comprise the same phase change material as the phase change material layer 50 according to the seventh embodiment. The thickness of the phase change material layer 50 is from about 10 nm to about 100 nm, and may be optimized for optimal performance of the PCM element.

The dielectric layer 77, the tapered via hole therein, and the tapered via hole sidewall 78 have the same structural characteristics as in the seventh embodiment.

Figure 11:
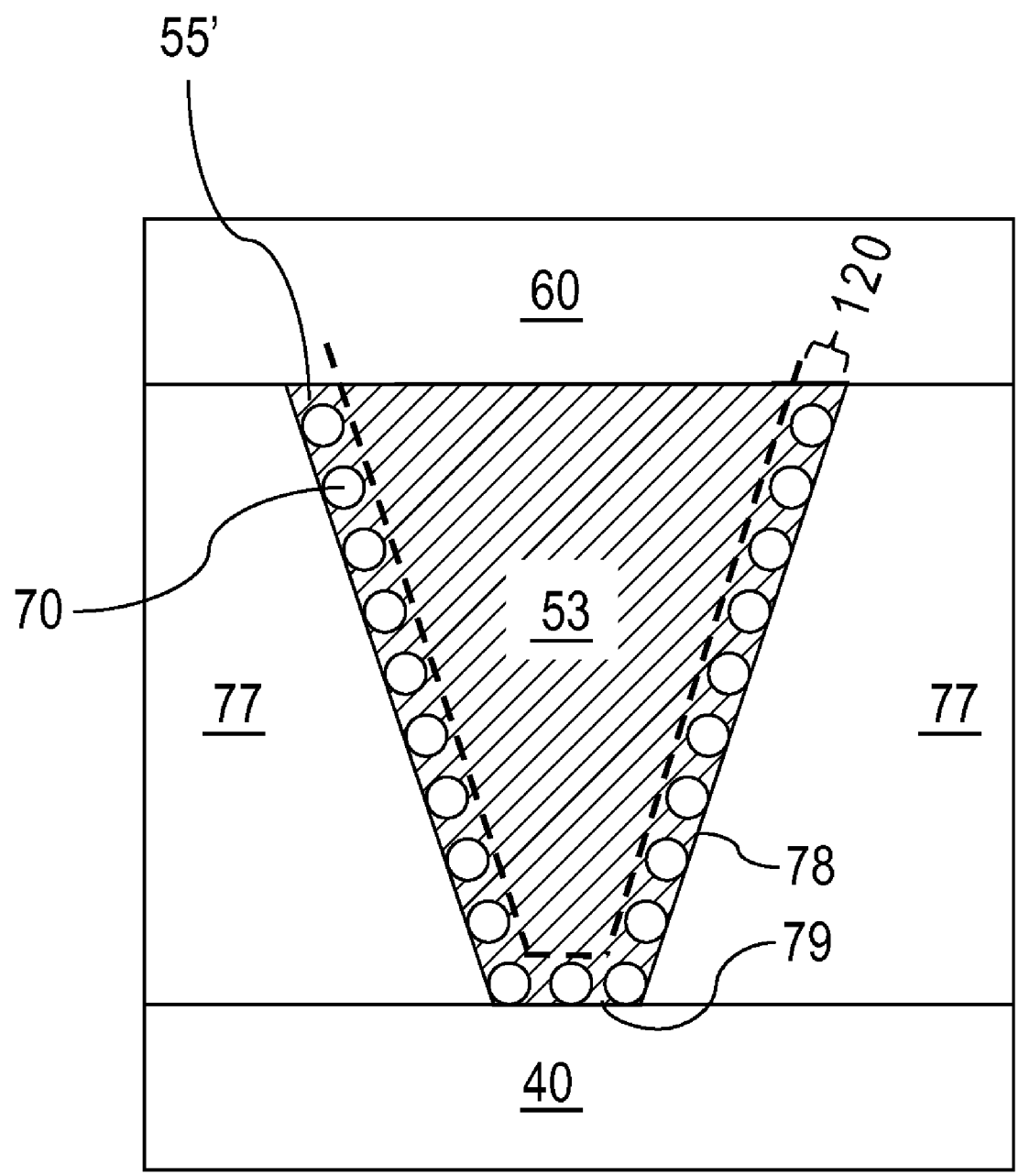

Referring to FIG. 11, a ninth exemplary structure according to a ninth embodiment of the present invention comprises a bottom conductive plate 40, a dielectric layer 77 containing a tapered via hole sidewall 78, a tapered via liner 120 having a liner bottom surface 79, a phase change material plug 53, and a top conductive plate 60. The bottom conductive plate 40 abuts the liner bottom surface 79 and the dielectric layer 77. The tapered via liner 120 abuts the tapered via hole sidewall 78 and contains a monolayer of insulating nanoparticles 70 that are embedded in and separated by a volume 55, of a phase change material. The phase change material plug 53 comprises the same phase change material as the volume 55, of the phase change material within the tapered via liner 120. The top conductive plate 60 abuts the dielectric layer 77, the tapered via liner 120, and the phase change material plug 53.

The bottom conductive plate 40 and the top conductive plate 60 may comprise the same material as the bottom conductive plate 40 according to the seventh embodiment. The bottom conductive plate 40 and the top conductive plate 60 may or may not, have the same composition. The thickness of the bottom conductive plate 40 is typically from about 10 nm to about 80 nm. Also, the thickness of the top conductive plate 60 is typically from about 10 nm to about 80 nm.

The phase change material plug 53 comprises the same phase change material as the phase change material layer 50 according to the seventh embodiment.

The dielectric layer 77, the tapered via hole therein, and the tapered via hole sidewall 78 have the same structural characteristics as in the seventh embodiment.

Figure 12:
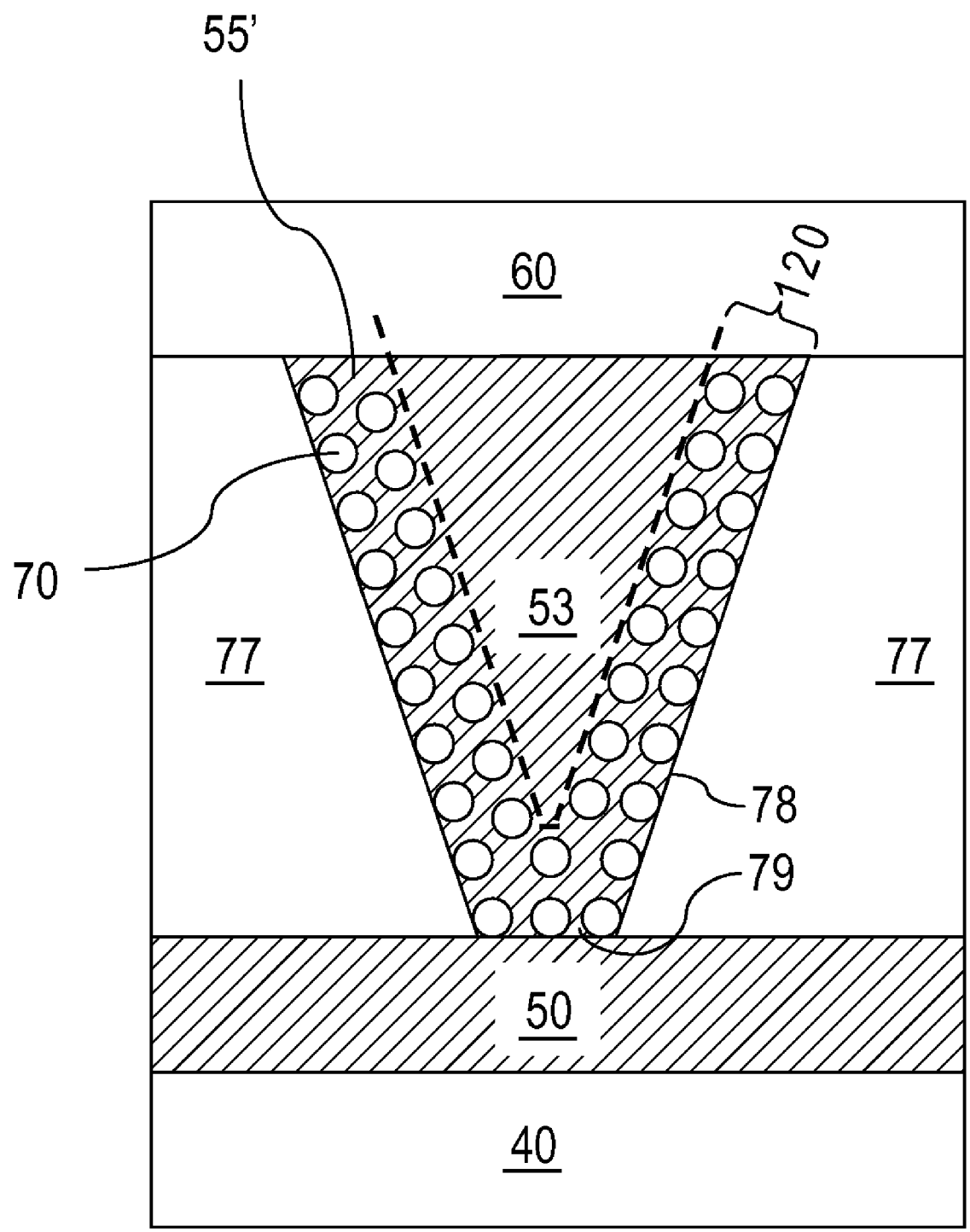

Referring to FIG. 12, a tenth exemplary structure according to a tenth embodiment of the present invention comprises the same structural elements and structural relationships as the eighth exemplary structure except that a monolayer of insulating nanoparticles in the eighth embodiment is replaced with a multilayer of nanoparticles in the tenth embodiment. The multiplayer of nanoparticles may be formed be a repeated formation of monolayers containing insulating particles 70, or alternatively, may be formed by a sputtering of an insulator material during deposition of a phase change material. Alternatively, oxygen maybe supplied during formation of a phase change material to form a multiplayer containing a mixture of volumes of the phase change material and insulating nanoparticles. For example, germanium oxide is readily formed intermixed with a germanium containing phase change material in the presence of sufficient oxygen during the deposition process.

Figure 13:
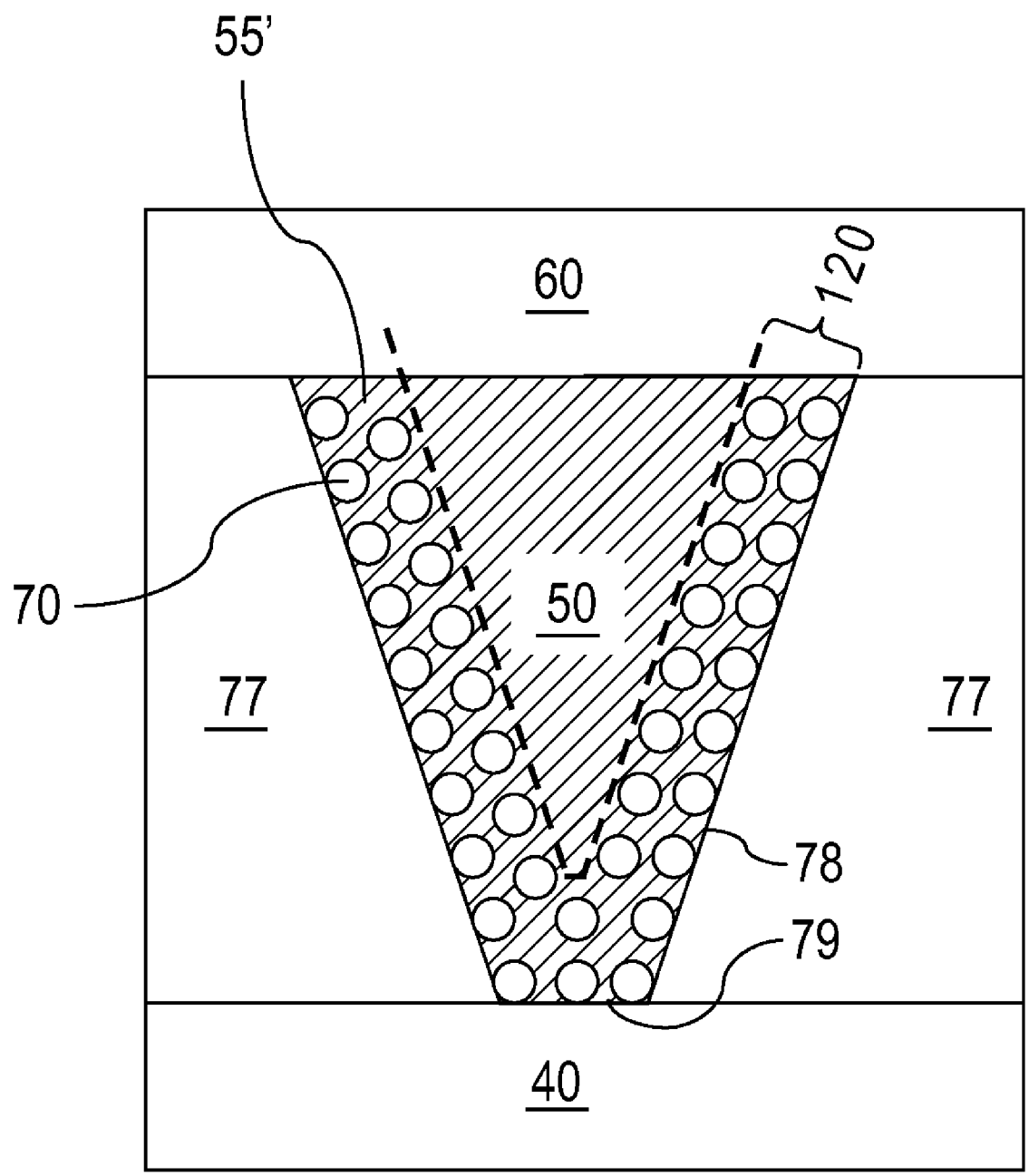

Referring to FIG. 13, an eleventh exemplary structure according to an eleventh embodiment of the present invention comprises the same structural elements and structural relationships as the ninth exemplary structure except that a monolayer of insulating nanoparticles in the ninth embodiment is replaced with a multilayer of nanoparticles in the eleventh embodiment. The same method for formation of a multilayer of insulating nanoparticles intermixed with a volume of a phase change material as in the tenth embodiment may be employed in the eleventh embodiment.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a dielectric layer containing a tapered via hole sidewall that extends from a lower end at a bottom surface of said dielectric layer to an upper end at a top surface of said dielectric layer;
   a tapered via liner contacting said tapered via hole sidewall, said tapered via liner having an outer liner bottom surface at a bottom side of a horizontal portion of said tapered via liner, and containing a monolayer of insulating nanoparticles that are embedded in, and separated by, a first volume of a conductive material;
   a conductive via plug comprising a second volume of said conductive material and contacting said tapered via liner, said first and second volumes being integrated as a single contiguous structure;
   a phase change material layer contacting said outer liner bottom surface and said dielectric layer; and
   a bottom conductive plate contacting said a phase change material layer, wherein said monolayer contiguously extends from a top surface of said phase change material layer to said upper end of said tapered via hole sidewall at said top surface of said dielectric layer.

2. The semiconductor structure of claim 1, wherein each of said insulating nanoparticles is a organic molecule confined within a monolayer and having a characteristic dimension in the range from about 1 nm to about 24 nm, said characteristic dimension being selected from the group consisting of a full length, a full width, and a diameter, and said nanoparticles form a monolayer.

3. The semiconductor structure of claim 1, wherein said phase change material layer comprises an alloy of a chalcogen element with at least one non-chalcogen element, wherein the chalcogen element is selected from the group consisting of Te, Se, and S, and the at least one non-chalcogen element is selected from the group consisting of Ge, Sb, Bi, Pb, Sn, As, Si, P, Ga, In, and Ag.

4. The semiconductor structure of claim 1, wherein said conductive via plug and said bottom conductive plate comprise a material selected from the group consisting of Ti, Ta, W, Mo, Al, Cu, Pt, Ir, La, Ni, Ru, and alloys thereof 5. A semiconductor structure comprising:
   a top conductive plate;
   a dielectric layer contacting a bottom surface of said top conductive plate, said dielectric layer containing a tapered via hole sidewall;
   a tapered via liner contacting said tapered via hole sidewall and said bottom surface of said top conductive plate, said tapered via liner having an outer liner bottom surface at a bottom side of a horizontal portion of said tapered via liner, and containing a monolayer of insulating nanoparticles that are embedded in, and separated by, a first volume of a phase change material;
   a via plug consisting of a second volume of said phase change material and encapsulated by said tapered via liner and said top conductive plate, said first and second volumes being integrated as a single contiguous structure; and
   a bottom conductive plate resistively connected to said top conductive plate through said via plug and said tapered via liner, wherein said monolayer of insulating nanoparticles contiguously extends from a top surface of said bottom conductive plate to said bottom surface of said top conductive plate.

6. The semiconductor structure of claim 5, wherein said bottom conductive plate contacts said horizontal portion of said liner bottom surface and said dielectric layer.

7. The semiconductor structure of claim 6, further comprising a phase change material layer consisting of yet another volume of said phase change material, wherein said phase change material layer contacts said horizontal portion said liner bottom surface, said dielectric layer, and said bottom conductive plate.

8. The semiconductor structure of claim 6, wherein said insulating nanoparticles comprise a dielectric material selected from the group consisting of silicon oxide, silicon nitride, aluminum oxide, aluminum nitride, silicon carbide, titanium oxide, tantalum oxide, ruthenium oxide, tungsten oxide, zinc oxide, silicon, germanium, germanium oxide, carbon, and a combination thereof.

9. The semiconductor structure of claim 6, wherein each of said insulating nanoparticles is a organic molecule confined within a monolayer and having a characteristic dimension from about 1 nm to about 24 nm, said characteristic dimension being selected from the group consisting of a full length, a full width, and a diameter, and said nanoparticles form a monolayer.

10. The semiconductor structure of claim 6, wherein said phase change material layer comprises an alloy of a chalcogen element with at least one non-chalcogen element, wherein the chalcogen element is selected from the group consisting of Te, Se, and S, and the at least one non-chalcogen element is selected from the group consisting of Ge, Sb, Bi, Pb, Sn, As, Si, P, Ga, In, and Ag.

11. The semiconductor structure of claim 1, wherein said upper end of said tapered via hole sidewall is directly adjoined to said top surface of said dielectric layer at an angle that is non-zero and non-orthogonal.

12. The semiconductor structure of claim 1, wherein a subset of said insulating nanoparticles in said tapered via liner contacts said top surface of said bottom conductive plate and another subset of insulating particles in said tapered via liner contacts said tapered via hole sidewall.

13. The semiconductor structure of claim 1, wherein said tapered via liner laterally surrounds all of said conductive via plug.

14. The semiconductor structure of claim 13, wherein said conductive via plug is laterally spaced from said dielectric layer by a non-horizontal portion of said tapered via liner, wherein a lateral separation distance between said conductive via plug and said dielectric layer is the same as a lateral thickness of said non-horizontal portion of tapered via liner.

15. The semiconductor structure of claim 14, wherein said conductive via plug is vertically spaced from said bottom conductive plate by a horizontal portion of said tapered via liner, wherein a vertical separation distance between said conductive via plug and said bottom conductive plug is the same as a vertical thickness of said horizontal portion of tapered via liner.

16. The semiconductor structure of claim 5, wherein said tapered via hole sidewall has a slope that is at an angle from said top surface of said bottom conductive plate, and said angle is non-zero and non-orthogonal.

17. The semiconductor structure of claim 5, wherein a subset of said insulating nanoparticles in said tapered via liner contacts said top surface of said bottom conductive plate and another subset of insulating particles in said tapered via liner contacts said tapered via hole sidewall.

18. The semiconductor structure of claim 5, wherein said tapered via liner laterally surrounds all of said conductive via plug.

19. The semiconductor structure of claim 18, wherein said conductive via plug is laterally spaced from said dielectric layer by a non-horizontal portion of said tapered via liner, wherein a lateral separation distance between said conductive via plug and said dielectric layer is the same as a lateral thickness of said non-horizontal portion of tapered via liner.

20. The semiconductor structure of claim 19, wherein said conductive via plug is vertically spaced from said bottom conductive plate by a horizontal portion of said tapered via liner, wherein a vertical separation distance between said conductive via plug and said bottom conductive plug is the same as a vertical thickness of said horizontal portion of tapered via liner.

* * * * *